US007990601B2

(12) United States Patent
Palmateer

(10) Patent No.: US 7,990,601 B2
(45) Date of Patent: Aug. 2, 2011

(54) SYSTEM AND METHOD FOR DISPLAY DEVICE WITH REINFORCING SUBSTANCE

(75) Inventor: Lauren Palmateer, San Francisco, CA (US)

(73) Assignee: QUALCOMM MEMS Technologies, Inc., San Diego, CA (US)

(*) Notice: Subject to any disclaimer, the term of this patent is extended or adjusted under 35 U.S.C. 154(b) by 0 days.

(21) Appl. No.: 12/727,171

(22) Filed: Mar. 18, 2010

(65) Prior Publication Data

US 2010/0172013 A1 Jul. 8, 2010

Related U.S. Application Data

(62) Division of application No. 11/144,305, filed on Jun. 3, 2005, now Pat. No. 7,710,629.

(60) Provisional application No. 60/613,801, filed on Sep. 27, 2004.

(51) Int. Cl.
*G02F 1/03* (2006.01)

(52) U.S. Cl. ......................... 359/245; 359/247; 257/682

(58) Field of Classification Search ................... 359/245
See application file for complete search history.

(56) References Cited

U.S. PATENT DOCUMENTS

| | | | | |
|---|---|---|---|---|
| 4,036,360 | A | | 7/1977 | Deffeyes |
| 4,074,480 | A | | 2/1978 | Burton |
| 4,531,126 | A | | 7/1985 | Sadones |
| 4,844,614 | A | | 7/1989 | Henderson et al. |
| 4,983,824 | A | | 1/1991 | Saaski et al. |
| 5,244,707 | A | | 9/1993 | Shores |
| 5,304,419 | A | | 4/1994 | Shores |
| 5,591,379 | A | * | 1/1997 | Shores .......................... 252/194 |
| 5,610,438 | A | | 3/1997 | Wallace et al. |
| 5,614,785 | A | | 3/1997 | Wallace et al. |
| 5,882,761 | A | | 3/1999 | Kawami et al. |
| 5,939,785 | A | | 8/1999 | Klonis et al. |
| 6,040,937 | A | | 3/2000 | Miles |
| 6,261,853 | B1 | | 7/2001 | Howell et al. |
| 6,445,062 | B1 | | 9/2002 | Honda |
| 6,589,625 | B1 | | 7/2003 | Kothari et al. |
| 6,650,455 | B2 | | 11/2003 | Miles |
| 6,674,562 | B1 | | 1/2004 | Miles et al. |
| 6,680,792 | B2 | | 1/2004 | Miles |
| 6,791,660 | B1 | | 9/2004 | Hayashi et al. |
| 7,042,643 | B2 | | 5/2006 | Miles |
| 7,060,895 | B2 | | 6/2006 | Kothari et al. |

(Continued)

FOREIGN PATENT DOCUMENTS

EP 0 969 700 1/2000

(Continued)

OTHER PUBLICATIONS

Keusseyan et al., A new approach for opto-electronic/MEMS packaging, Proceedings 52nd Electronic Components and Technology Conference, ECTC May 2002, pp. 259-262.

(Continued)

*Primary Examiner* — Jessica T Stultz
(74) *Attorney, Agent, or Firm* — Knobbe Martens Olson & Bear LLP

(57) ABSTRACT

A package structure and method of packaging an interferometric modulator with a reinforcing substance to help support the integrity of the package. In some embodiments the reinforcing substance is a desiccant integrated into the backplate or the transparent substrate.

17 Claims, 12 Drawing Sheets

U.S. PATENT DOCUMENTS

| | | | |
|---|---|---|---|
| 7,123,216 | B1 | 10/2006 | Miles |
| 7,164,520 | B2 | 1/2007 | Palmateer et al. |
| 7,368,803 | B2 | 5/2008 | Gally et al. |
| 7,405,924 | B2 | 7/2008 | Gally et al. |
| 7,443,563 | B2 | 10/2008 | Palmateer et al. |
| 7,710,629 | B2 | 5/2010 | Palmateer |
| 2002/0056900 | A1 | 5/2002 | Liu et al. |
| 2002/0063322 | A1 | 5/2002 | Robbins et al. |
| 2002/0119724 | A1 | 8/2002 | Hammel |
| 2002/0126364 | A1 | 9/2002 | Miles |
| 2002/0149096 | A1 | 10/2002 | Liebeskind |
| 2003/0062186 | A1 | 4/2003 | Boroson et al. |
| 2003/0108306 | A1 | 6/2003 | Whitney et al. |
| 2003/0121418 | A1 | 7/2003 | Loop et al. |
| 2003/0122137 | A1 | 7/2003 | Hashimoto |
| 2003/0138656 | A1 | 7/2003 | Sparks |
| 2003/0160021 | A1 | 8/2003 | Platt et al. |
| 2003/0167798 | A1* | 9/2003 | Borrelli et al. ............... 65/29.11 |
| 2003/0184412 | A1 | 10/2003 | Gorrell |
| 2004/0051929 | A1 | 3/2004 | Sampsell et al. |
| 2004/0061492 | A1 | 4/2004 | Lopes et al. |
| 2004/0100677 | A1 | 5/2004 | Huibers et al. |
| 2004/0115856 | A1 | 6/2004 | Jung et al. |
| 2004/0122175 | A1 | 6/2004 | Hekal |
| 2004/0166603 | A1 | 8/2004 | Carley |
| 2004/0189195 | A1 | 9/2004 | Allemand |
| 2004/0213962 | A1 | 10/2004 | Bourdelais et al. |
| 2004/0259370 | A1 | 12/2004 | Bergman |
| 2005/0074919 | A1 | 4/2005 | Patel et al. |
| 2005/0093134 | A1 | 5/2005 | Tarn |
| 2005/0253283 | A1 | 11/2005 | Dcamp et al. |
| 2007/0268201 | A1 | 11/2007 | Sampsell |
| 2008/0164544 | A1 | 7/2008 | Palmateer et al. |

FOREIGN PATENT DOCUMENTS

| | | |
|---|---|---|
| EP | 1 251 546 | 10/2002 |
| EP | 1 418 154 | 5/2004 |
| JP | 2003-217828 | 7/2003 |
| WO | WO 02/39513 | 5/2002 |
| WO | WO 02/42716 | 5/2002 |
| WO | WO 03/009317 | 1/2003 |

OTHER PUBLICATIONS

Moraja, et al., Advanced Getter Solutions at Wafer Level to Assure High Reliability to the last Generations MEMS, IEEE Reliability Physics Symposium Proceedings, 2003, pp. 458-459.

Previti et al., Getters: micromolecular scavengers for packaging, Proceedings International Symposium on Advanced Packaging Materials Processes, Properties and Interfaces, 2001, pp. 201-206.

Office Action in Chinese App. No. 200510105041.8 dated May 9, 2008.

Partial European Search Report for App. No. 05255705.5, dated Oct. 28, 2008.

Extended European Search Report for App. No. 05255705.5, dated Jan. 14, 2009.

Notice of Reasons for Rejection dated May 12, 2009 in Japanese App. No. 2005-271672.

Office Action dated Oct. 16, 2008 in U.S. Appl. No. 11/144,305.

Office Action dated Jul. 7, 2009 in U.S. Appl. No. 11/144,305.

* cited by examiner

*Column Output Signals*

| *Row Output Signals* | | *+V bias* | *-Vbias* |
|---|---|---|---|
| | *0* | *Stable* | *Stable* |
| | *+ΔV* | *Relax* | *Actuate* |
| | *−ΔV* | *Actuate* | *Relax* |

SYSTEM AND METHOD FOR DISPLAY DEVICE WITH REINFORCING SUBSTANCE

RELATED APPLICATIONS

This Application is a divisional of U.S. patent application Ser. No. 11/144,305, filed Jun. 3, 2005, now issued U.S. Pat. No: 7,710,629, which claims priority to U.S. Provisional Application No. 60/613,801, filed Sep. 27, 2004, the contents of which are hereby incorporated by reference in its entirety

BACKGROUND

1. Field of the Invention

The field of the invention relates to microelectromechanical systems (MEMS). More specifically, the field of the invention relates to interferometric modulators with a reinforcing substance, e.g., a desiccant.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled “Detailed Description of Certain Embodiments” one will understand how the features of this invention provide advantages over other display devices.

Some embodiments of the invention are package structures for an interferometric modulator that include a reinforcing substance. In some embodiments, the reinforcing substance is a desiccant. The desiccant can be molded or integrated the backplate in such a manner that it provides a structural support for the backplate. In addition the amount and type of desiccant can be designed to optimize the water removing function while minimizing the amount of material, or cost of material, placed with the device. Various embodiment is described in greater detail below.

In some aspects, the invention is a display device package that comprises a transparent substrate, an interferometric modulator configured to modulate light transmitted through the transparent substrate, a backplate cover sealed to the transparent substrate to form a package so that the interferometric modulator is inside of the package, and a reinforcing substance in contact with the backplate cover. The reinforcing substance is configured to provide structural support to the backplate cover.

In some aspects, the invention is a method of manufacturing a display device. The method comprises providing a transparent substrate that comprises an interferometric modulator configured to modulate light transmitted through the transparent substrate, providing a backplate cover configured to mount to the transparent substrate, and applying a reinforcing substance to the backplate cover. The reinforcing substance is configured to provide structural support to the backplate and is also a desiccant. The method further comprises sealing the backplate cover to the transparent substrate.

In some aspects, the invention is a display device. The display device comprises a transparent substrate that comprises an interferometric modulator configured to modulate light transmitted through the transparent substrate, a backplate cover sealed to the transparent substrate to form a package so that the interferometric modulator is inside the package, and a prolonged-acting desiccant associated with the backplate cover. The prolonged-acting desiccant has a half-life for absorbing water of not less than 10 hours.

In some aspects, the invention is a device that comprises an interferometric modulator, a backplate cover sealed to a transparent substrate to form a package so that the interferometric modulator is inside the package, and a reinforcing substance applied to an internal side of the backplate cover. The reinforcing substance is configured to provide structural support to the backplate cover and is a desiccant.

In some aspects, the invention is a display device package that comprises a transparent substrate, an interferometric modulator configured to modulate light transmitted through the transparent substrate, a backplate cover sealed to the transparent substrate to form a package so that the interferometric modulator is inside the package, and a means for reinforcing the backplate cover.

In some aspects, the invention is a display device created by applying a reinforcing substance to a backplate cover, allowing the reinforcing substance to dry, and sealing a transparent substrate comprising an interferometric modulator to the backplate cover. The reinforcing substance is a desiccant.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

In some aspects, the invention is a reinforcing substance on the surface of a backplate in a package of an interferometric modulator. The reinforcing aspect of the substance can be achieved in a variety of ways. For example, the reinforcing substrate can fill variations or imperfections in the backplate and thereby provide additional structural support. Alternatively, the reinforcing substance can form a reinforcing structure in itself, which can add additional strength to the backplate. This can allow for thinner backplates to be used. In one embodiment, the reinforcing substance is a desiccant. In another embodiment, the desiccant is a prolonged acting or long acting desiccant, which, while not necessarily absorbing large amounts of water immediately, is able to absorb water over a relatively prolonged period of time. In some embodiments, the desiccant is covered by a barrier that reduces the amount of water that is exposed to the desiccant and thereby extends the effective lifetime of the desiccant. In some embodiments the desiccant is positioned selectively on the backplate to add support to weak points on the backplate, e.g., on the corners of the backplate. Methods of making and using these embodiments are also contemplated.

Figure 1:
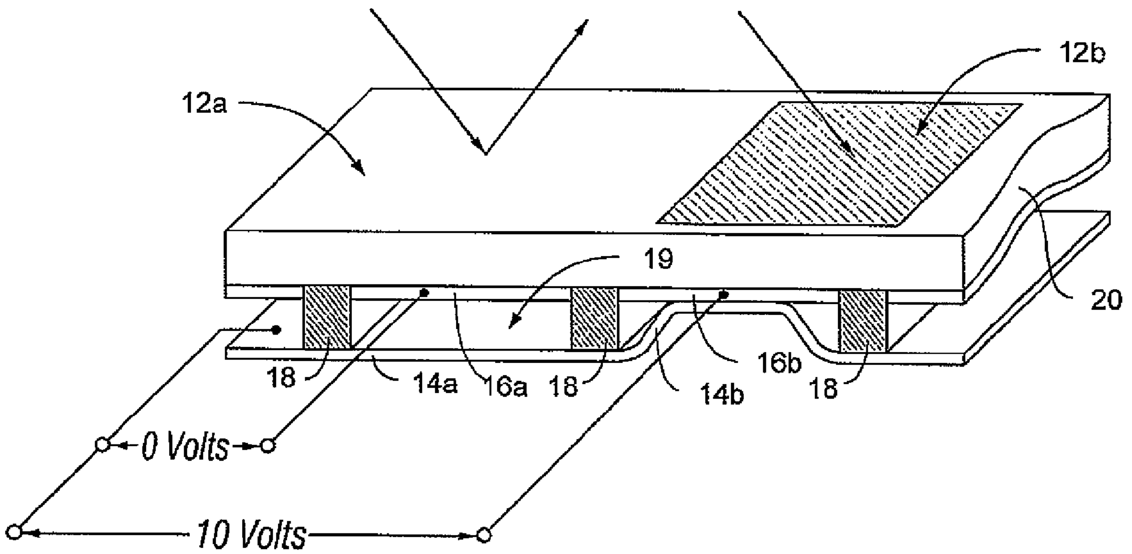
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12_a_ and 12_b_. In the interferometric modulator 12_a_ on the left, a movable and highly reflective layer 14_a_ is illustrated in a relaxed position at a predetermined distance from a fixed partially reflective layer 16_a_. In the interferometric modulator 12_b_ on the right, the movable highly reflective layer 14_b_ is illustrated in an actuated position adjacent to the fixed partially reflective layer 16_b_.

The fixed layers 16a, 16h are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers 14a, 14b are separated from the fixed metal layers by a defined gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
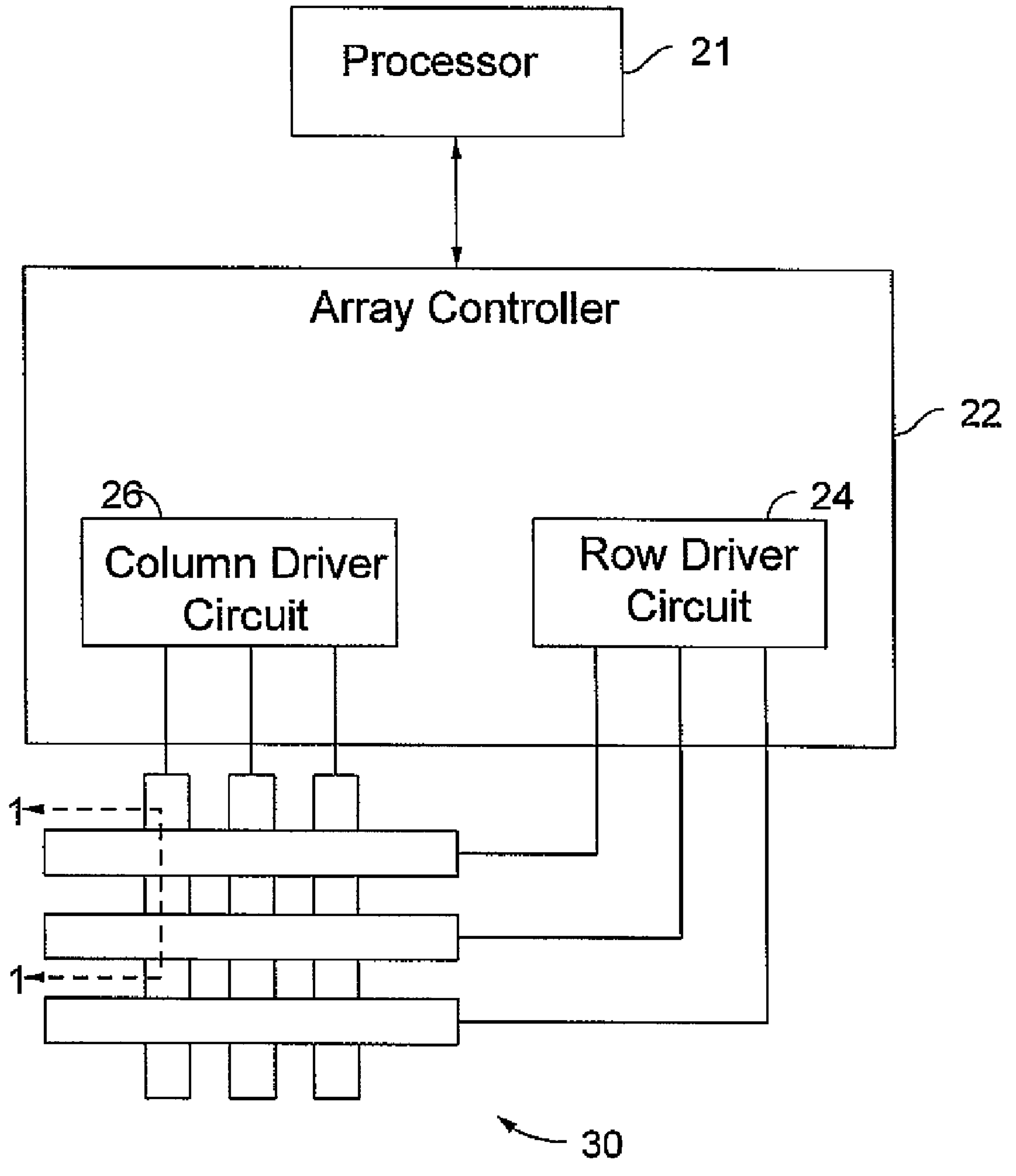
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 Pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
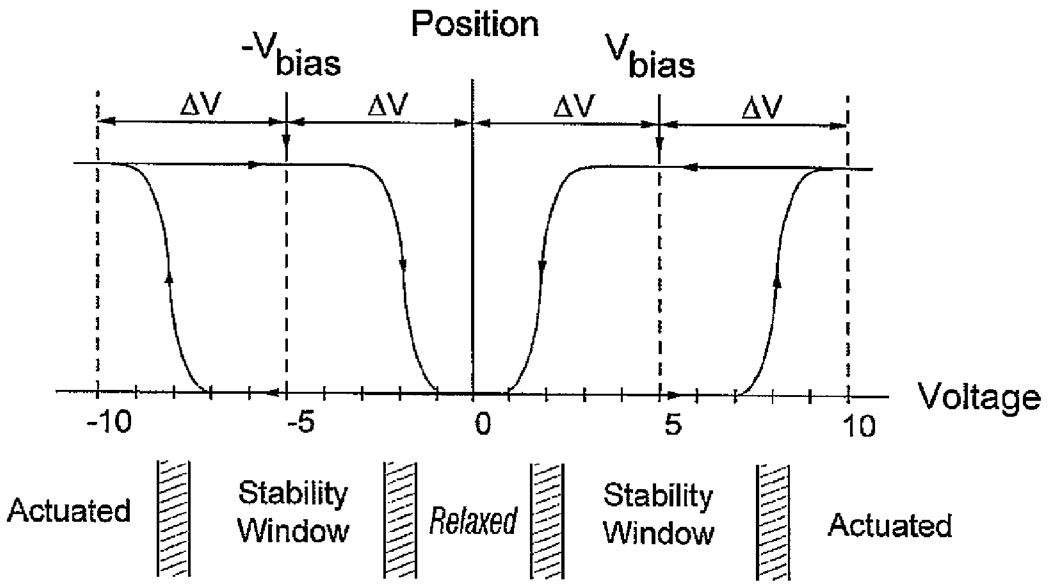
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
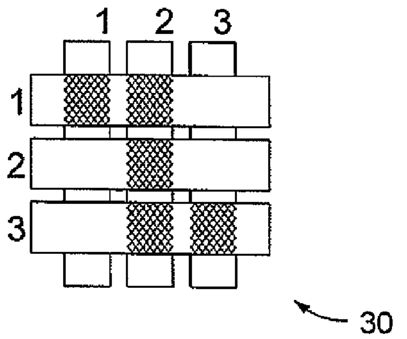
FIGS. 5A and 5B illustrate one exemplary timing diagram for row and column signals that may be used to write a frame of display data to the 3×3 interferometric modulator display of FIG. 2.
Figure 5B:
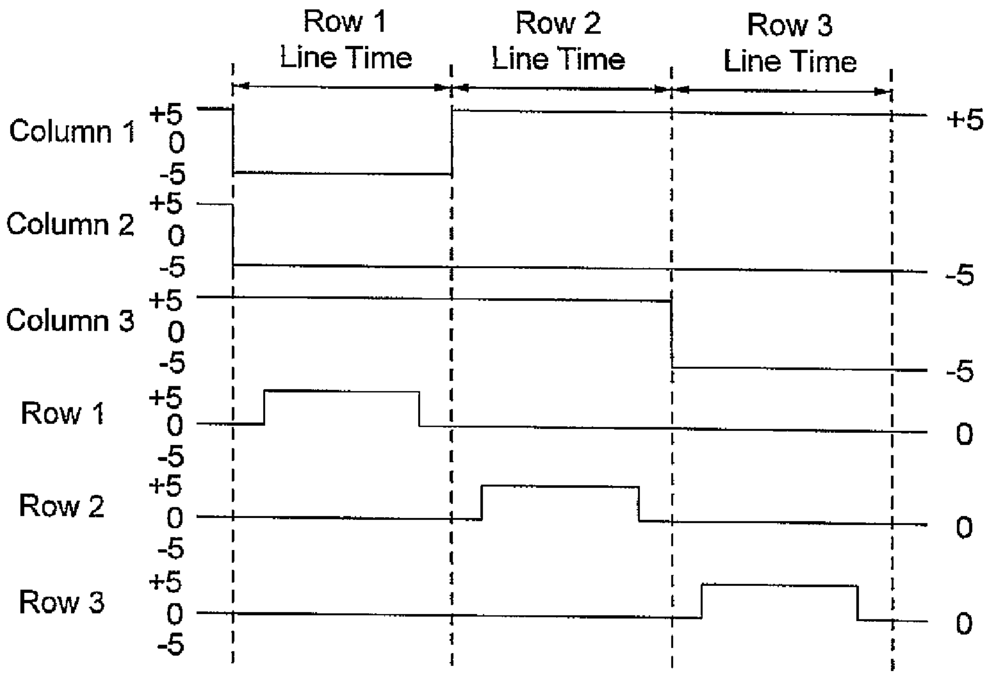

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
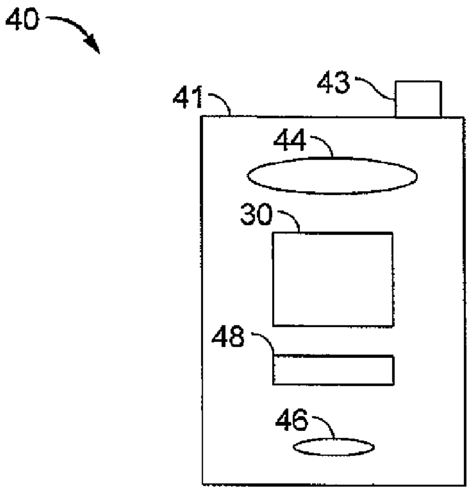
FIG. 6A is a system block diagram illustrating an embodiment of a display device.
Figure 6B:
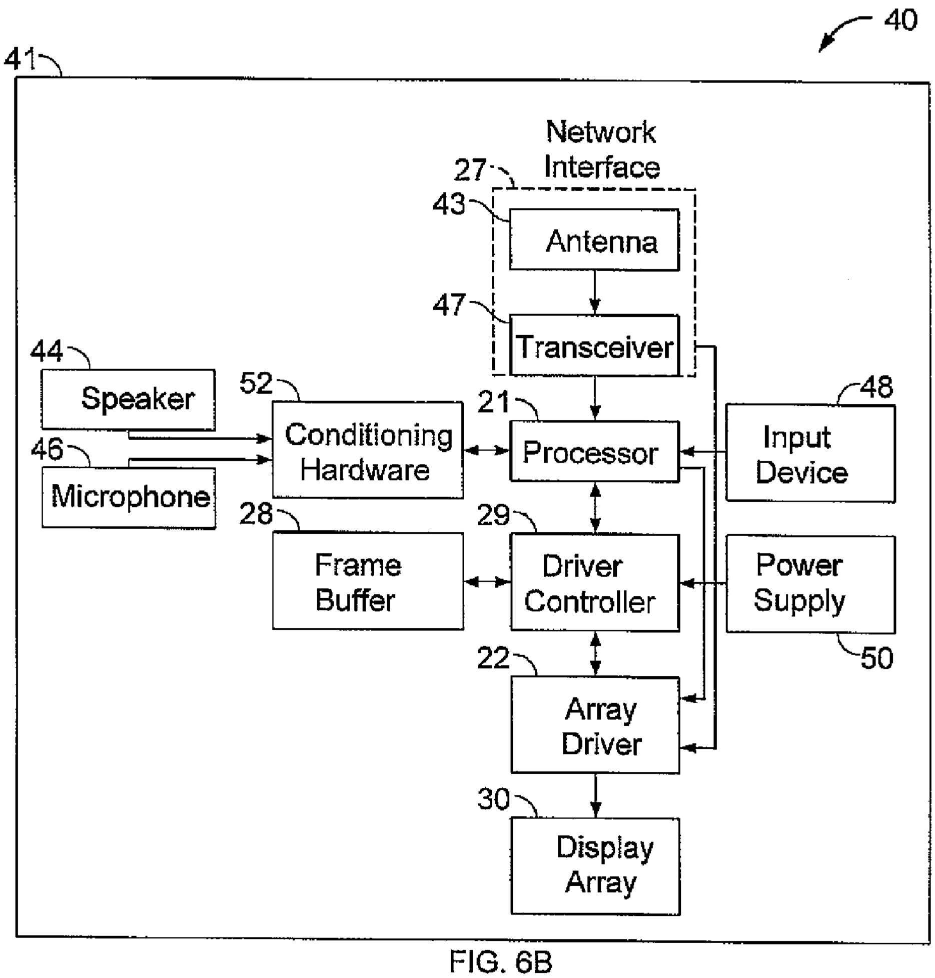
FIG. 6B is a system block diagram illustrating some of the components of an embodiment of a display device.

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 44 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 44, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
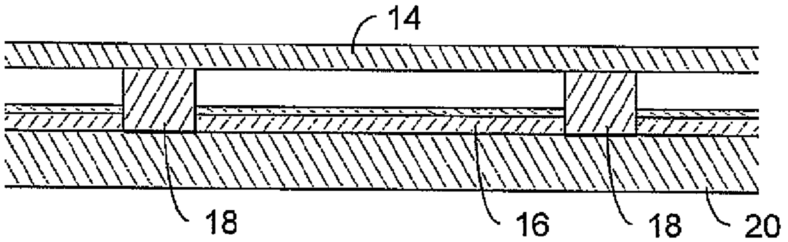
FIG. 7A is a cross section of the device of FIG. 1.
Figure 7B:
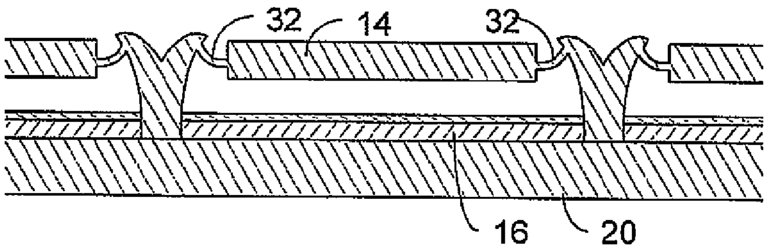
FIG. 7B is a cross section of an alternative embodiment of an interferometric modulator.
Figure 7C:
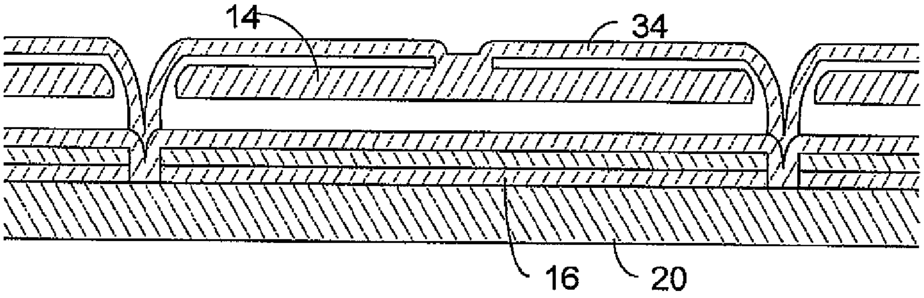
FIG. 7C is a cross section of another alternative embodiment of an interferometric modulator.

The details of the structure of interferometric modulators that operate in accordance with the principles set forth above may vary widely. For example, FIGS. 7A-7C illustrate three different embodiments of the moving mirror structure. FIG. 7A is a cross section of the embodiment of FIG. 1, where a strip of metal material 14 is deposited on orthogonally extending supports 18. In FIG. 7B, the moveable reflective material 14 is attached to supports at the corners only, on tethers 32. In FIG. 7C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of known techniques may be used to produce the above described structures involving a series of material deposition, patterning, and etching steps.

Figure 8:
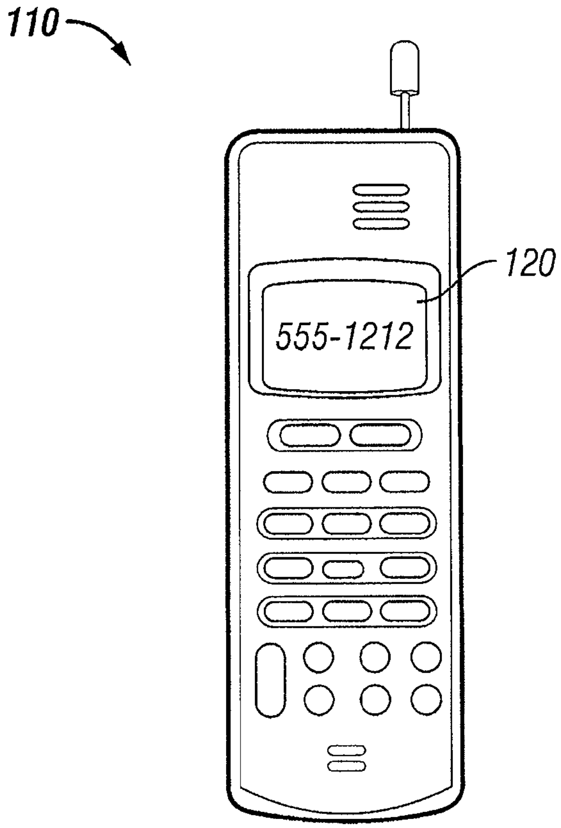
FIG. 8 schematically illustrates a front view of one embodiment of a wireless telephone handset having an electronic display.

As discussed above, in some embodiments, the invention can be used in electronic displays for use in portable electronic devices, such as wireless telephones, personal digital assistants, computer monitors, digital music players and the like. FIG. 8 illustrates a wireless telephone handset 110 having an electronic display 120. In this illustration, the electronic display 120 is displaying the telephone number "555-1212".

Electronic display 120 can be any type of display including light emitting diode (LED), organic light emitting diode (OLED), or an interferometric modulator (IMOD) direct view electronic display.

Figure 9:
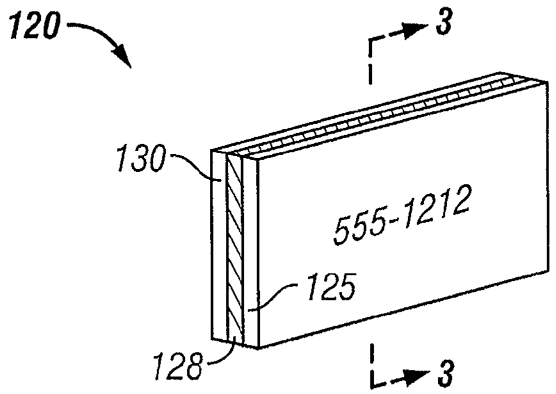
FIG. 9 schematically illustrates a perspective view of one embodiment of an electronic display.
Figure 10:
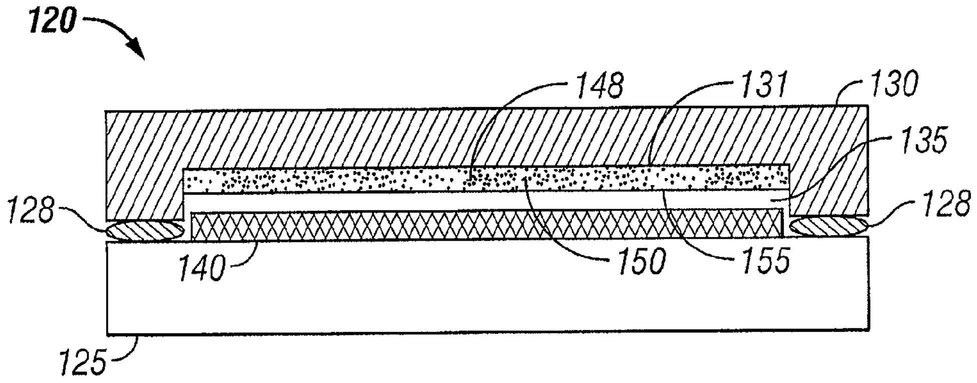
FIG. 10 schematically illustrates a cross-sectional view of one embodiment of an electronic display taken across the line 3-3 from FIG. 9.

FIG. 10 shows a perspective view of the display 120 from FIG. 9. As shown, the display 120 has a transparent front surface 125, a sealant 128, and a backplate 130. As will be explained below, within the display 110, and between the transparent front surface 125 and backplate 130 are the electronics for the particular display technology. For example, within the display can be the electronics for an LED, OLED or IMOD display.

Interferometric displays, which are based on MEMS (micro-electro-mechanical-systems) technology, are spatial light modulators that may be used in electronic display applications, such as a wireless telephone handset. Interferometric modulators modulate light by controlling the self-interference of light that strikes a surface of the modulator. For example, U.S. Pat. No. 5,835,255 discloses one example of an interferometric modulator which is hereby incorporated by reference in its entirety.

Reinforcing Substance

While the size of the backplate 130 can be miniaturized to allow for smaller display devices, this results in a thinner backplate which could be relatively weak. Additionally, some manufacturing processes can leave minor imperfections in the backplate, which may weaken the structure as well. Thus, stronger backplates to allow for smaller devices can be desirable. Additionally, it should be realized that each of the above display types are differentially sensitive to moisture. Thus it can be advantageous to provide a means for reducing the amount of moisture that may come in contact with the device.

As mentioned above, aspects of the invention relate to the manufacturing and packaging of electronic displays with a reinforcing substance. The reinforcing substance is configured to add structural support to the package. The reinforcing substance can also be configured to absorb water molecules that permeate the display packaging once it has been manufactured, e.g., it can be a desiccant. As will be appreciated by one of skill in the art, a desiccant maintains a low humidity environment within the display package and prevents water vapor from adversely affecting the operation of the display electronics. This will be explained in further detail below.

Figure 11:
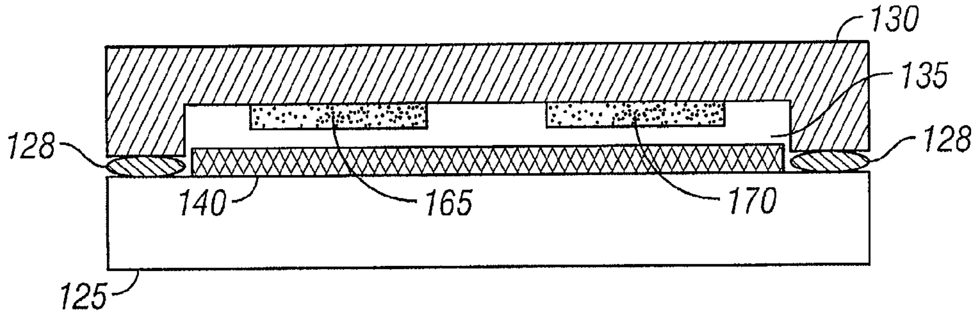
FIG. 11 schematically illustrates a first alternate embodiment of an electronic display taken across the line 3-3 from FIG. 9.

Interferometric modulators typically include a transparent substrate, such as glass, as well as moving parts that have a protected space in which to move. A schematic of a basic package structure for an interferometric modulator is illustrated in FIG. 10, although it should be realized that the invention is not limited to packaging a particular type of display or the use of a particular substrate material, such as glass. As shown in FIG. 10, a basic package structure includes the transparent substrate 125 and the backplate cover or "cap" 130. These components are held together by the sealant 128, but provide a cavity 135 formed between these two components. Within the cavity 135 and adjacent the transparent substrate 125 is an interferometric modulator 140. As illustrated, the cavity 135 can also be provided by the use of a backplate glass that has a recessed cavity. Using a recessed cavity 135 allows the sealant material 128 to be relatively thin, and thus not be as subject to transmission of water vapor. An alternative package structure is shown in FIG. 11.

The transparent substrate 125 can be any transparent substance capable of having display electronics, such as a thin film MEMS device built upon it. Such transparent substances include, but are not limited to, glass, plastic, and transparent polymers. Images are displayed through the substrate 125, which serves as an imaging surface. The interferometric modulator array may comprise membrane modulators or modulators of the separable type. Examples of such devices are described in U.S. Pat. No. 5,835,255 to Miles. The skilled artisan will appreciate that the backplate 130 can be formed of any suitable material, such as glass, metal, foil, polymer, plastic, ceramic, or semiconductor materials (e.g., silicon).

The interferometric modulator 140 can be a membrane modulator or modulators of the separable type. Examples of such devices are described in U.S. Pat. No. 5,835,255 to Miles, hereby incorporated in its entirety by reference.

As will be appreciated by one of skill in the art, the backplate 130 can independently be strong enough so that the integrity of the packaging system is not compromised, either throughout the manufacture or throughout the use of the device. However, as discussed in more detail below, the dimensions, shape, composition, and other characteristics of the backplate can be altered depending on the presence or absence of a reinforcing substance in the package. Especially when moving to larger display diagonals, reinforcement of the package allows for the manufacture of a relatively thin display. In addition, reinforcement of the package maintains a minimum bowing of the recessed glass to the order or 100-200 micron when moderate pressure is applied to the backplate. Thus, in some embodiments, in which a reinforcing substance is to be used, a backplate can be thinner or may be insufficient to independently maintain the structural integrity of the packaging system. In other embodiments, the reinforcing substance can simply add additional strength to the system or other desired characteristics, such as a drying ability, or both characteristics. This backplate 130 may also be referred to as a “backplane.” It will be understood that the terms “display,” “package structure,” and “package” can be used interchangeably, as used herein.

The sealant or seal 128 is typically provided to join the transparent substrate 125 and backplate 130 to form the package structure 120. The sealant 128 is typically a non-hermetic, seal, such as a conventional epoxy-based adhesive. In addition, the sealant 128 may be made from any polymer, or plastic composition. In one embodiment, the sealant 128 provides a hermetic seal that prevents water vapor and moisture from entering the cavity 135. In other embodiments, the seal 128 can be a polyisobutylene (sometimes called butyl rubber, and other times PIB), o-rings, polyurethane, thin film metal weld, liquid spin-on glass, or solder, among other types of seals that can have a range of permeability of water vapor of about 0.2-4.7 g mm/m$^2$ kPa day.

As shown in FIG. 10, there is a cavity 135 between the backplate 130 and the substrate 125. The moving parts of a MEMS device, such as the movable mirrors 14*a*, 14*b* of an interferometric modulator array described above, preferably have a protected space in which to move. As illustrated in FIG. 10, the cavity 135 can be provided by the use of a backplate 130 that has a recessed cavity.

It has been realized that the addition of an additional reinforcing substance to the backplate can be useful in providing additional strength to the backplate without necessarily requiring the greater space required by a thicker backplate.

The reinforcing substance can be selected from a variety of substances. The reinforcing substance can be an epoxy, a desiccant, or some combination thereof. In light of the present disclosure, one of skill in the art will be able to determine appropriate substances, how to prepare, and how to use them. For example, pastes can be prepared by mixing a CaO desiccant or Zeolite desiccant with a polymeric binder. An example of a desiccant paste is the commercially available Cookson HiCap 2800™ desiccant paste. This paste can be screen printed or dispensed onto the backplate. It can have a thin sheet on the order of 50 microns for example, or various shapes and patterns, as described in more detail below. The paste can be heated and activated after dispensing. Another type, a Zeolite based paste for example, can be spread in a similar way, but may not require heating or activated after application. As described in more detail below, the reinforcing substance provides structural support to the package. This support can be due to, for example, the strength and integrity of the reinforcing substance, the shape of the reinforcing substance, its ability to interact with the backplate, or the position or location in which the reinforcing substance is placed. These options are discussed in more detail below.

Figure 12:
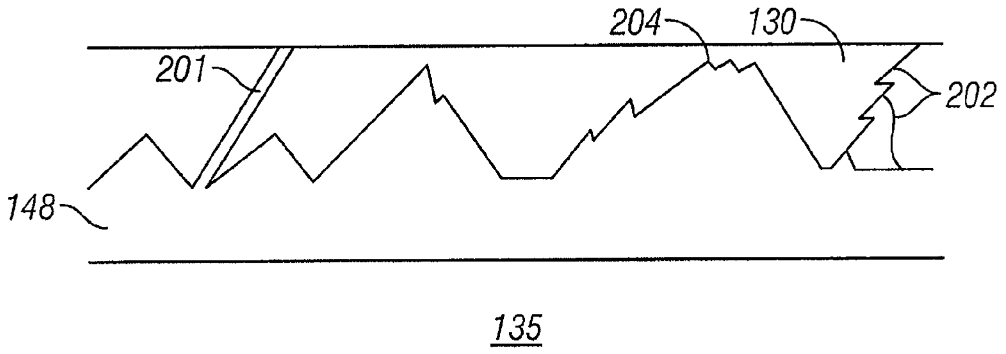
FIG. 12 schematically illustrates several embodiments of how the reinforcing substance can be used to add support or increase the integrity of the backplate.

For example, the integrity of the package can be improved through the filling of holes or crevices in the backplate. Some methods of manufacturing the backplate involve abrasive techniques that can over-etch or crack the backplate. These imperfections in the backplate can weaken the backplate and even provide possible routes through which water or other ambient substances can enter the device. While making a thicker backplate might overcome some of this problem, such a process may require more material and result in a larger device. However, it should be realized that even a thicker backplate may not solve the problem of backplane weakness and reduce the potential of having fracture points in the glass due to usage and temperature variations. As can be envisioned, any cracks in the glass can propagate independent of whether the glass is thick (for example, >about 1.1 mm) or thin (for example, <about 0.7 mm). Additionally, throughout the manufacturing process, a crack could still occur in the backplate. To reduce the chance of such an occurrence, a reinforcing substrate 148 can be added to the backplate 130 that fills, e.g., fractures 202 or over-etched sections 204, e.g., as shown in FIG. 12. Thus, in some embodiments, the reinforcing substance can fill a passage 201 through a backplate or cover a crack 202 to prevent it from becoming larger. In these embodiments, the reinforcing substance 148 can be a desiccant, however, if there are holes to be filled that lead to the external atmosphere, a desiccant may not be an optimal choice.

In some embodiments, the cracks or gaps themselves are locations of possible breakage 204, and the reinforcing substance 148 is added to fill in these gaps. Thus, direct physical support can be supplied to the backplate in such a manner. In such an embodiment, any substance, e.g., a desiccant, that provides support to the backplate can be used. The reinforcing substance need not supply support to the system at all times, for example, the filling in of these gaps might only reduce the chance that these sections will be deformed if pressure is added to the system, thereby reducing the chance that stresses will be localized to the thinner areas of the backplate.

Figure 13:
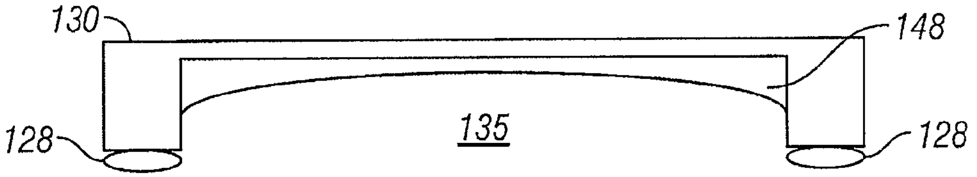
FIG. 13 schematically illustrates an alternative embodiment of how the reinforcing substance can add support to the backplate.
Figure 14A:
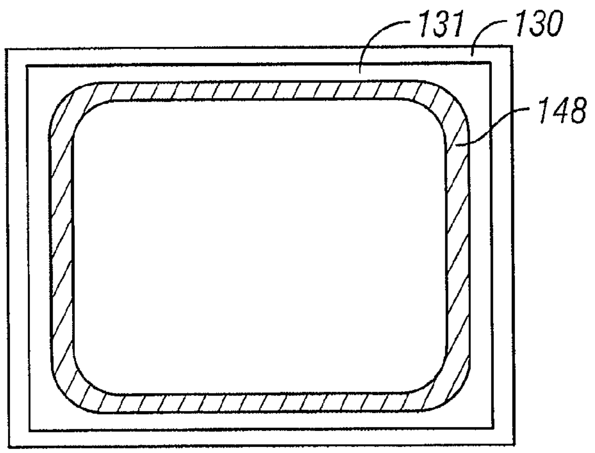
FIG. 14A schematically illustrates one embodiment of how a reinforcing substance can be configured.
Figure 14B:
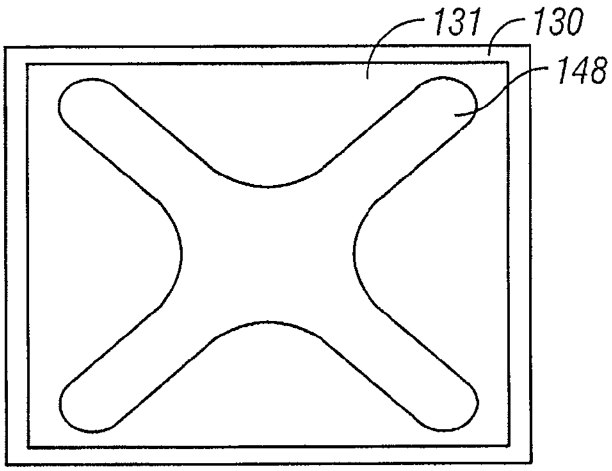
FIG. 14B schematically illustrates another embodiment of how a reinforcing substance can be configured.
Figure 14C:
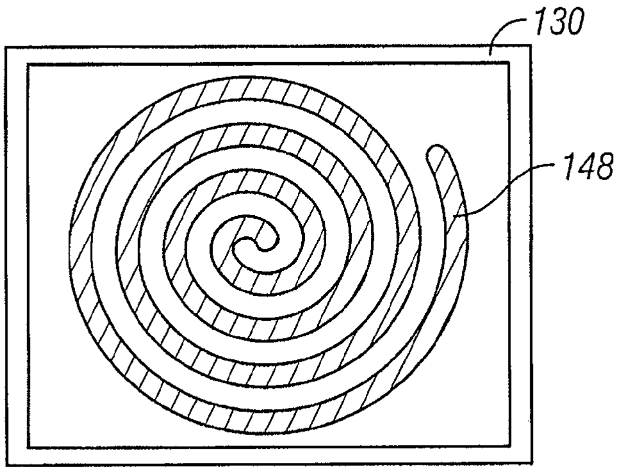
FIG. 14C schematically illustrates another embodiment of how a reinforcing substance can be configured.
Figure 14D:
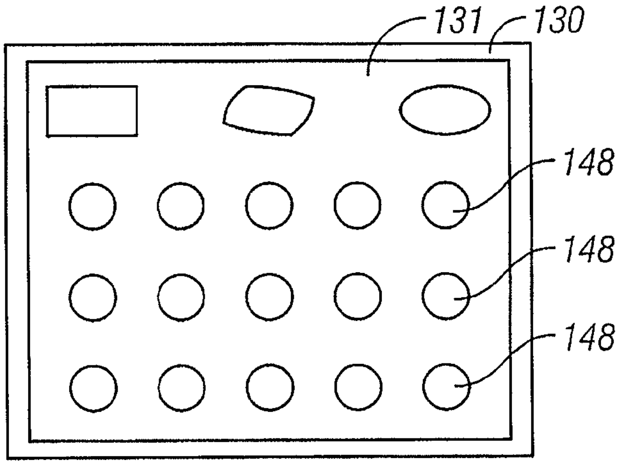
FIG. 14D schematically illustrates another embodiment of how a reinforcing substance can be configured.

In some embodiments, the support provided from the reinforcing substance is provided because of the structure or shape of the reinforcing substance. This shape dependent reinforcing substance can be achieved through various embodiments. In one embodiment, it is the shape of an entire section of the desiccant that adds support to the backplate. For example, a plane of supporting substance can be added to the backplate; thus effectively adding thickness, and strength, to the backplate (e.g., as shown in FIG. 10, 148). Alternatively, the reinforcing substance can be shaped to have a concave shape, so that an arch of reinforcing substance is created, further adding support to the backplate (e.g., FIG. 13). In one embodiment, the reinforcing substance is configured so as to reduce any of various stresses that are caused because of the combination of the reinforcing substance and the backplate. Thus, the shape of the reinforcing substance can lack any or numerous right angles, and any corners can be rounded. A reinforcing substance, such as a desiccant added to a backplate, can be configured to minimize possible areas of frailty or that are subject to fracture created by any right angles formed by the reinforcing substance. Examples of such embodiments are shown in FIGS. 14A-14D. Right angles in shape of the reinforcing substance can allow for forces in the system to be concentrated onto a relatively small point on the backplate; thus, reinforcing substances that are attached to the backplate without such angles reduce the chance that any forces transmitted from the reinforcing substance will be as specifically focused on the backplate.

In some embodiments, the reinforcing substance, e.g., desiccant, is added to areas of the backplate that can benefit from additional strengthening. For example, the reinforcing substance can be added to places where there are right angles or places where there are corners in the backplate. For example, the reinforcing substance can be added to places where there are carve outs or where two planes of the backplate meet. Such an area can be described as a "Weak point" of the backplate. In some embodiments, the reinforcing substance is only associated with the weak point of the backplate. In some embodiments, the reinforcing substance is primarily associated with a weak point of the backplate. In some embodiments, more than half of the reinforcing substance is located next to a weak point, for example 50-60, 60-70, 70-80, 80-90, 90-95, 95-100 percent of the reinforcing substance. "Associated" can mean that the presence of the material provides structural support to the particular weak point. In some embodiments, the reinforcing substance is located over the weak point. In some embodiments, one applies the reinforcing substance so that most of the reinforcing substance is associated with a weak point on the backplate.

In some embodiments, soda lime glass is used for the recessed backplate. The glass is typically etched or sandblasted in order to create the recessed areas for the desiccant. Soda lime glass can cost less than borosilicate types of glass. However, soda lime glass can be more susceptible to fractures when under stress and in the presence of water. The use of the desiccant covering the surface of a recessed backplate made of soda lime glass can reinforce the backplate by preventing water from being deposited on the recessed areas. Water on the surface of the soda lime glass can act to increase the rate of fracture, especially when the glass is under stress, e.g., in some assembly processes. Preventing water from depositing on the surface can act to improve the strength of the recessed glass and reduce the chance of fractures developing in the product. As will be appreciated by one of skill in the art, this tendency to fracture under the combination of water and stress is characteristic of soda lime glass above other substances. Thus, the desiccant on the surface of the recessed glass, can, during assembly, act to strengthen or reinforce the backplate by reducing the amount of water present. As will be appreciated by one of skill in the art, in some embodiments, the combination of a reinforcing desiccant on a soda lime glass backplate is contemplated. In some embodiments, a low cost and relatively weak backplate is used, which can be reinforced with a desiccant or other reinforcing substance.

In some embodiments, the expansion characteristics of the reinforcing substance and the backplate are matched. In some embodiments, the coefficients of thermal expansion ("CTE") of the reinforcing substance and the coefficient of thermal expansion of the backplate are matched. Thus, in one embodiment, the CTEs are the same, allowing the two objects to expand at a similar rate when heated or cooled, which can prevent or reduce stresses that could otherwise be caused between the two. In other words, without matching the CTE of the backplate and the reinforcing substance (e.g., a desiccant), one runs a risk of breaking or deforming one or both upon heating or cooling of the device. As will be appreciated by one of skill in the art, the device can be heated during use or simply during the manufacturing process, for example, during curing of a desiccant or the reinforcing substance. One of skill in the art can determine if the CTEs are significantly the same by adding a layer of the reinforcing substance to the backplate and heating them both. If stresses are generated upon heating (which can be, for example, observed from the presence of bowing of the backplate or backplate breakage) then the CTEs are not significantly the same.

When the coefficients of thermal expansion ("CTE") do not match, one can configure the reinforcing substance so as to reduce a negative impact from the difference in coefficients (of course, one does not have to do this if the differences in CTEs are acceptable for the desired device and one can still do this even if the CTEs are about the same or the same). Examples of these configurations are shown in FIGS. 14A-14D. Thus, one may wish to optimize coverage of imperfections in the backplate, e.g., as shown in FIG. 12, while still providing a reinforcing substance across the backplate. For example, a reinforcing substance shaped in a loop can provide structural support around the perimeter of the internal section of the backplate 131, while not covering the entire surface of the backplate, which could result in a larger amount of force being exerted on the backplate from the reinforcing substance (e.g., FIG. 14A). Alternatively, an "X" or star configuration (e.g., FIG. 14B), a spiral configuration (FIG. 14C) or an array, grid or checkered configuration (FIG. 14D) can also supply additional support without restricting large degrees of relative movement between the backplate and the supporting material, e.g., desiccant. These designs help to reduce the number of points of stress created or to reduce the amount of stress at various points on the backplate. In a preferred embodiment, the substance is a desiccant, and more preferably a long lasting desiccant. In one embodiment, one can reduce the negative impact of differences in CTEs by reducing or minimizing the ratio of the surface area of each section of reinforcing material to the perimeter of the area of each section of reinforcing material.

In some embodiments, the amount of support provided to the backplate increases the backplate's ability to withstand breakage by any increased amount of force or weight, for example, an increase of 1-10, 10-30, 30-50, 50-80, 80-100% or more. In some embodiments, the addition of the reinforcing substance allows for the thickness of the backplate to be reduced, for example by as much as 1-10, 10-30, 30-50, 50-70, 70-80, 80-90% or more. In some embodiments, multiple supporting layers are provided, e.g., an initial layer to plug any holes or cracks, and a second layer to add additional support and a desiccant ability. In some embodiments, the reinforcing material is applied to a surface, other than the backplate. For example, a reinforcing substance could be applied to a seal or a part of a substrate, if desired.

In some embodiments, the reinforcing substance can be in a solid form, e.g., a sheet form, and can be associated with the backplate with a "glue" or adhesive. The glue and reinforcing substance can act together to provide support to the backplate. Alternatively, one or the other can individually supply support to the backplate. For example, the reinforcing substance can be an adhesive or epoxy that only fills in gaps or cracks in the backplate. In some embodiments, the solid form reinforcing substance is a sheet of desiccant, which together with an epoxy that can attach it to the backplate, add support to the backplate.

The following discussion uses desiccants as an example of a reinforcing substance; however, in light of the present specification, one of skill in the art will understand that the various embodiments described below can also be used with substances that are not desiccants, with predictable results where appropriate. Likewise, one of skill in the art will appreciate that any of the above embodiments can be made by using a desiccant as the reinforcing substance, although some may be more advantageous than others.

Desiccant as a Reinforcing Substance

Generally, it is desirable to minimize the permeation of water vapor into the package structure and thus control the environment inside the display 120 and hermetically sealing it to ensure that the environment remains constant. An example of a hermetic sealing process is disclosed in U.S. Pat. No. 6,589,625. When the humidity within the package exceeds a level beyond which surface tension from the moisture becomes higher than the restoration force of movable elements within the display electronics, the movable elements (e.g., the movable mirrors 14*a*, 14*b* described above) may become permanently stuck to the surface.

Thus, in some embodiments, the reinforcing substance is a desiccant. This will allow a desiccant to be sealed within the display 120. In this embodiment, the structure of the desiccant or desiccant area 148 can be formed within the cavity 135 and attached to the backplate 130. The desiccant can be attached to the surface 131 of the backplate 130 that forms the cavity 135. The desiccant area can include a desiccant material 150, and a membrane cover 155. In some embodiments, the desiccant is a solid or rigid desiccant that can directly add support to the backplate. The desiccant area 148 can be used within displays that have either hermetic or non-hermetic sealants. In displays having a hermetic seal, the desiccant area can be used to control moisture resident within the interior of the package and also act as a sealant for the backplate 130.

In some embodiments of the invention, the desiccant area 148 is configured across the interior surface of the backplate in such a way as to minimize vapor leakage through the backplate and into the cavity 135. In some embodiments, the desiccant is configured to further increase the amount of water absorbed by the desiccant, e.g., a shape that exposes a greater surface area of the desiccant to the internal atmosphere.

In one embodiment, the desiccant material is configured to act as a patch to seal any leakage holes in the backplate 130. As discussed above, recessed backplates can be weaker than backplates that do not have a recessed portion, and thus can be more subject to fractures when they are sandblasted during manufacture. The desiccant spread on the surface can also be used to reinforce the structural reliability of the backplate (e.g., FIG. 12). In the case that the backplate is made to be very thin, the reinforcement supplied by spreading the desiccant material can allow a thinner backplate to be used which otherwise would be too fragile without the spreading of this desiccant to reinforce the backplate material (e.g., FIGS. 12-14D). This may be especially true in the case of a glass backplate. In the case that the backplate is made of metal or foil or other material, the desiccant can be used to help support the material so that it is less bendable and it will be reinforced or shaped in a desirable way. As discussed above, matching the coefficients of thermal expansion of the desiccant and the backplate will also add strength to the final product, as it can reduce the stresses that can build up between the two during heating. Additionally, using particular patterns or configurations of the desiccant (e.g., FIG. 14A-14D) can further allow for additional structural support, the drying ability of a desiccant, and a reduction in possible stresses resulting from differences in the CTE between the desiccant and the backplate.

In some embodiments, the desiccant is 1) configured to reduce the stresses due to CTE differences between the backplate and the desiccant, 2) configured to optimize or prolong the drying ability of the desiccant, and 3) configured to provide structural support to the backplate. For example, in FIG. 14D, an array of desiccant patches allows for 1) a large amount of the surface of the backplate to be supported and strengthened by the desiccant, 2) provides a large amount of desiccant, and 3) still provides gaps in the desiccant so that any differences in the CTE will not be additive over long stretches of the surface of the desiccant and instead will only occur over shorter sections. The desiccant can also be used to help absorb any of the residual moisture that is trapped in the crevices of the backplate after a wet clean for example, or simply from residual ambient moisture trapped in the crevices. The desiccant can be spread on the backplate and can also aid to reduce particle contamination from getting on the active display area that may be a result of any sandblasted or loose fragments due to the preparation of the glass.

In other embodiments, a relatively small amount of the desiccant is added, thus, only enough desiccant to fill small cracks in the backplate, but not enough to fully cover the entire surface of the backplate. Alternatively, after adding an amount of the desiccant to the backplate to cover the entire surface, any desiccant above the cracks or crevices can be removed. This will provide a backplate in which the desiccant is provided throughout the backplate so as to add support, but where there are gaps in the coverage of the desiccant so that differences in the CTE will not be compounded over large continuous areas of the backplate.

Generally, any hygroscopic substance that can absorb moisture from the air can be used as the desiccant material 150. Preferably, the desiccant does not interfere with the optical properties of the interferometric modulators 140. In one embodiment of the invention, the desiccant preferably includes sealant properties that allow it to act as a moisture sealant for the backplate 130. For example, it should be realized that the desiccant can be admixed with other compositions, such as epoxies or resins in order to provide sealant properties in addition to the advantageous desiccant properties. The desiccant/epoxy mix is preferably not used to seal the backplate and the substrate. Suitable desiccant materials include, but are not limited to, zeolites, calcium sulfate, calcium oxide (e.g., HiCap2800™ desiccant), silica gel, molecular sieves, surface adsorbents, bulk adsorbents, and chemical reactants. Other desiccant materials include indicating silica gel, which is normal silica gel with some of its granules coated with cobalt chloride. This material changes color as it becomes saturated with water. Additionally, the desiccant mixed with epoxy can have superior properties as a reinforcing substance. In some embodiments, the desiccant is optimized to absorb water over a prolonged period of time. This can be achieved by altering the shape and surface exposure of the desiccant, or the composition of the desiccant.

In some embodiments, the desiccant material 150 can be printed or sprayed onto a surface of the interior of the package, such as the backplate after it has been sandblasted or etched using standard photolithographic techniques in order to make the reinforcing substance 148. A mask is preferably first applied to the backplate prior to etching, preferably using standard photolithographic techniques, in order to form recessed pockets or windows in the backplate, allowing the package to be thinner with a thinner perimeter seal, preferably having a thickness of about 15 microns seal width. It will be understood that etching techniques, such as sandblasting and wet etching, are preferred. The skilled artisan will understand that, alternatively, a stencil can be used instead of a photolithographic mask. After the pockets or windows have been created, the desiccant material 150 is applied (e.g., sprayed or brushed on) in the recessed pockets or windows. It will be understood that the mask is preferably not removed until the desiccant material 150 has been applied to the recessed pockets or windows so that there is little danger of applying the desiccant material 150 to the non-recessed areas of the backplate. A thin foil can be applied over the desiccant material to protect the desiccant material 150 if the backplate is manufactured and transported prior to assembly with other parts of the package. The desiccant material 150 can be activated after the package is completed.

In some embodiments, the desiccant material can be integrated into the material that forms the backplate. Such material can be made by incorporating the desiccant into the plastic that forms the backplate. Preferably, the desiccant is incorporated into the backplate on the internal side of the backplate. Examples of such material include 2AP (Sud-Chemie), which combines precise amounts of a desiccant, such as molecular sieve or silica gel, with a polymer. Because the desiccant material is incorporated into the backplate itself, there is no need to add desiccant material in a separate step during the packaging process. In addition, 2AP can be customized to control the moisture adsorption rate. Alternatively, a thin coating of the same material can be added back to the backplate after the initial cavity has been carved out.

Another material suitable for a backplate reinforcing substance is made by Capitol Specialty Plastics Inc. (Auburn, Ala.). This material combines a desiccant with a channeling agent into a polymer that can be molded or extruded into many shapes. Almost any type of polymer can be used with the desiccant. This type of desiccant plastic allows the entire backplate to act as a moisture absorber. Other materials suitable for such a backplate include, but are not limited to, material delivered with foil protection, which can be chemically or plasma etched off, such as amorphous silicon, chrome, and similar materials. While these backplate substances could be used to make complete backplates, preferably, the substances are used on an internal side of another backplate that lacks a desiccant.

Generally, the packaging process to produce the display can be accomplished in a vacuum, pressure between a vacuum up to and including ambient pressure, or pressure higher than ambient pressure. The packaging process can also be accomplished in an environment of varied and controlled high or low pressure during the sealing process. There can be advantages to packaging the display in a completely dry environment, but it is not necessary. Similarly, the packaging environment can be of an inert gas at ambient conditions, or the cavity 135 can be created to contain an inert gas, such as nitrogen, at ambient conditions. Packaging at ambient conditions allows for a lower cost process and more potential for versatility in equipment choice because the device can be transported through ambient conditions without affecting the operation of the device.

Long Life or Prolonged Acting Desiccant

In another embodiment, a desiccant is selected based on its use in an interferometric modulator device. In these embodiments, the desiccant can serve as a reinforcing substance, or alternatively, simply serve as a desiccant with the desired characteristics.

It has been realized that an interferometric modulator device can tolerate higher amounts of water vapor than other technologies, such as OLED. As such, low levels of water vapor can be permissible and the initial amount of water vapor present in the package need not be as low as in OLED devices. Thus, the type and variety of desiccant can be chosen to be optimized for use in an interferometric modulator device. For example, calcium oxide can be used within an interferometric modulator device, even though in its natural unaltered state it absorbs moisture fairly slowly in comparison to other desiccants, such as zeolites. CaO can be tailored to be a fast acting desiccant, although in a preferred embodiment, it refers to a composition that has a, prolonged duration of functionality. This is shown more particularly in reference to the data shown in Example 1. Such an embodiment can allow for cheaper materials to be used, alternative manufacturing processes to be employed, or the use of a desiccant that, while not as "effective" at drying initially, is able to absorb water for a longer duration. Due to the more robust nature of the interferometric modulator device, a greater diversity of desiccants can be chosen to be incorporated into the device. This provides significant advantages over prior devices. The desiccants with a more prolonged effective life can be used in the interferometric modulator device and need not result in any degradation of the pixels near the edge of the sealant, where the water flux may enter the package. Other devices, such as OLEDs, require a fast acting desiccant at these areas due to their sensitivity to water vapor.

In addition to being in solid or gel form, the desiccant material 150 can alternatively be in powder form. These powders can be inserted directly into the area 148 or they may be mixed with an adhesive prior to entrance into the area 148. It should be realized that the area 148 can take any form, and can be of any thickness that provides the proper desiccating function for the display 120.

Typically, in packages containing desiccants, the lifetime expectation of the device can depend on the lifetime of the desiccant. When the desiccant is fully consumed, the electronic display 120 can fail to operate as sufficient moisture enters the cavity 135. The theoretical maximum lifetime of the display device is determined by the water vapor flux into the cavity 135 as well as the amount and type of desiccant material. The theoretical lifetime of the device can be calculated with the following equations:

$$\text{lifetime} = \frac{\text{desiccant\_capacity}(g)}{\text{water\_vapor\_flux}(g/\text{area}/\text{day}) * \text{perimeter\_seal\_area}}$$

$$\text{water vapor flux} = -P\frac{dp}{dt}$$

where P is the water vapor permeation coefficient for the perimeter seal 128 and $$\frac{dp}{dt}$$

is the water vapor pressure gradient across the width of the sealant 128.

In the embodiment of the display 120 having a hermetic sealant, the lifetime of the device is not as dependent on the desiccant capacity, or the geometry of the sealant. In display devices wherein the sealant 128 is not hermetic, the lifetime of the device is more dependent on the capacity of the desiccant to retain moisture.

The membrane 155 preferably is made from a compound that is strong enough to contain the desiccant material, but also allow water vapor to pass through the membrane and contact the desiccant material. One example of such a material is Tyvek® (Dupont Corporation) or polyethylene, preferably with a low moisture vapor transmission rate (MVTR). The MVTR of the barrier depends upon the type and thickness of the materials used and the external environmental conditions. It should be realized that the membrane 155 can adhere directly to the backplate 130, or be sealed to the backplate 130 with an adhesive.

Table 1 below provides the MVTR for a number of membrane materials. By knowing the MVTR (in grams of water per square foot per day), the total surface area of the membrane (membrane surface area) and the length of time in storage, the amount of moisture penetrating the package over time can be calculated.

TABLE 1

| | MVTR* | |
|---|---|---|
| Material | gm/m$^2$-day | gm/ft$^2$-day |
| Aluminum Foil Wrapping 0.025 mm | 0.5 | 0.05 |
| Aluminum Foil Wrapping 0.009 mm | 1.0 | 0.09 |
| Cellulose Films ('Cellophane') 400's MXXT Grade (Polyvinylidene Chloride Coated) Polyvinylidene/Polyvinyl Chloride Films ('Saran') 0.005 cm (0.002 in) | 1.5 | 0.14 |
| Polyvinylidene/Polyvinyl Chloride Films ('Saran') 0.0013 cm (0.0005 in) | 3.0 | 0.28 |
| Polyethylene Films ('Polythene') 0.0125 cm (0.005 in) Waxed Paper (45.5 kg (100 lb) per DC Ream) | 4.0 | 0.37 |
| Cellulose Films ('Cellophane') 300's MSAT Grade (Cellulose Nitrate Coated) | 7.5 | 0.70 |
| Glassine Lacquered (16 kg (35 lb) per DC Ream) | 9.0 | 0.84 |
| Polyethylene Film ('Polythene') 0.005 cm (0.002) in) | 10.0 | 0.93 |
| Polyethylene Film ('Polythene') 0.0025 cm (0.001 in) | 20.0 | 1.86 |
| Polyethylene Coated Kraft (9 kg (20 lb) per DC Ream) | 30.0 | 2.79 |

*Determined at 100° F. and 90% relative humidity

Another embodiment of the display 120 is illustrated in FIG. 11. As shown, two desiccant areas 165, 170 are formed within the interior cavity 135. The dual areas 165, 170 function to remove moisture from within the cavity 135. Additionally, the areas 165, 170 can function as sealants to prevent moisture from traversing the backplate 130 at particular areas. It should be realized that in this embodiment the desiccant material used to fill the areas can be the same or different in the two areas. For example, one area may be filled with a desiccant that binds water molecules very quickly, but wears out in a relatively short period of time. An example of such a desiccant is zeolite. The other area may be filled with a desiccant that absorbs water molecules more slowly, but lasts longer. One example of such a compound is calcium oxide. Of course, embodiments of the invention are not limited to a particular number of integrated desiccant areas, or a particular desiccant used within each area. The display device may have 1, 2, 3, 4, 5, 6 or more desiccant areas inside without departing from the spirit of the invention.

The following example is not meant to limit the invention as the invention is defined in the claims.

EXAMPLE 1

This Example demonstrates an analysis of a prolonged acting desiccant and how one can determine the effectiveness and possible duration over which the desiccant can be effective.

Figure 15A:
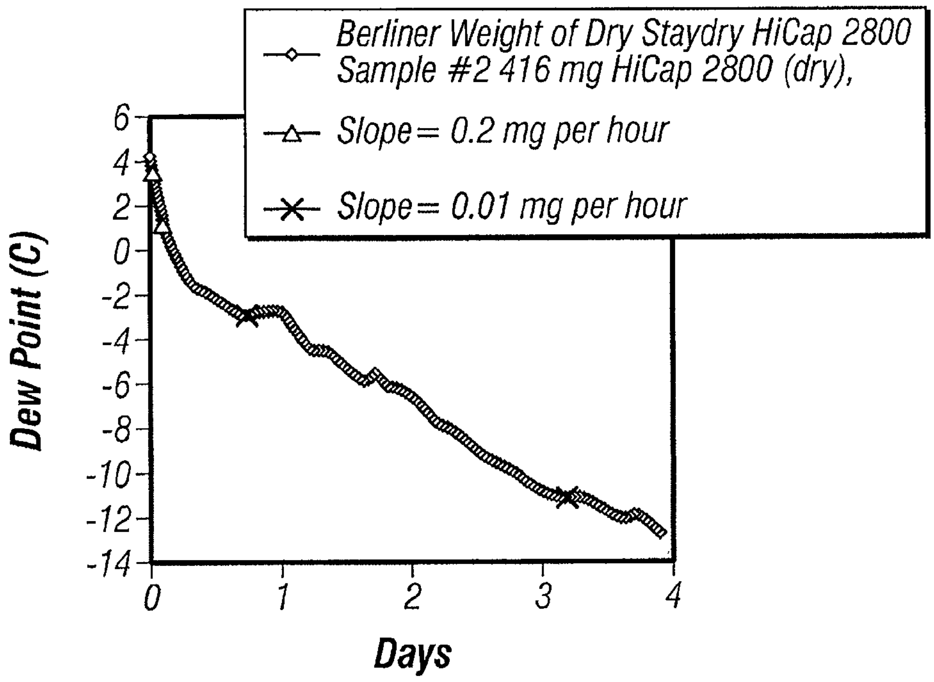
FIG. 15A is a graph depicting the rates of water absorption for HiCap2800™ desiccant, a prolonged acting desiccant.

A set amount of HiCap2800 desiccant (53 mm×63 mm) was collected and stored in a sealed container. A volume of air within the sealed container was then measured for moisture through the use of a dew point sensor. This was repeated multiple times over several days. The result is shown in FIG. 15A. In this example, the temperature of the chamber was about 22-28° C., the volume of the chamber was about 427 cm$^3$, and the initial amount of water in the chamber was such that the dew point was about +4° C. The amount of the desiccant used was 416 mg. The fast component slope is marked by triangles and the slow component slope is marked by "X"s.

As can be seen, the initial slope of the curve is 0.2 mg/hour. During the first day, the slope slowed to 0.01 mg/hour. At this slower rate, and in an amount of 3 mg of desiccant, it would take more than 300 hours to saturate this desiccant. These results can be typical of prolonged acting desiccants.

Figure 15B:
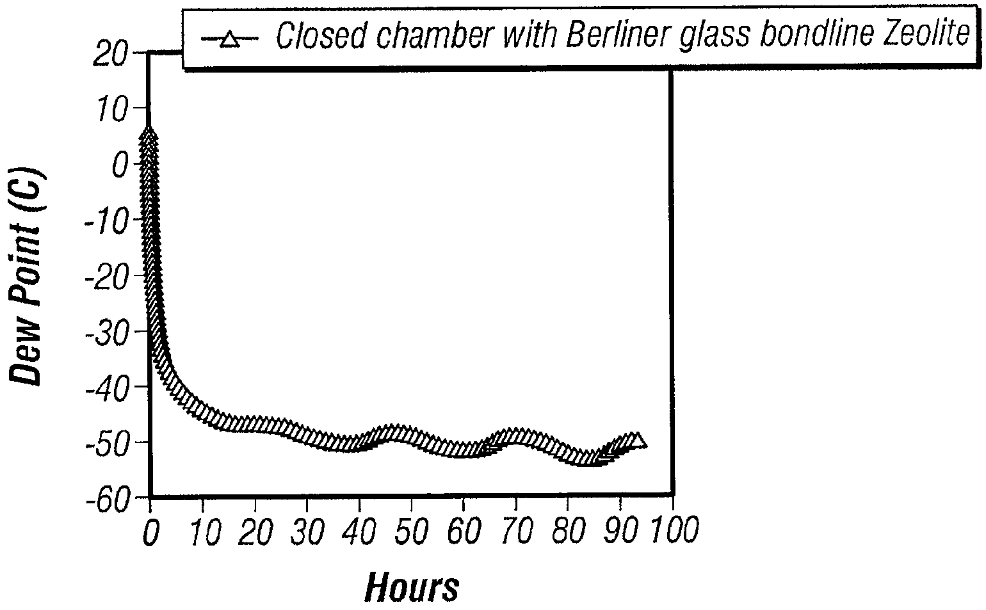
FIG. 15B is a graph depicting the rates of water absorption for Bondline Zeolite desiccant, a fast acting desiccant.

Similarly, the process can be carried out for testing the duration of effectiveness for fast acting desiccants, such as a Bondline Zeolite™ desiccant. The results from such a similar test are shown in FIG. 15B. As can be observed, this desiccant rapidly absorbs water and reaches the lowest dew point within the first day. The amount of Zeolite was 0.860 grams and resulted in a weight gain of 9.9 mg, which was 1.2% of the 8% expected (which is 15% of the lifetime to 100% saturation).

Figure 16:
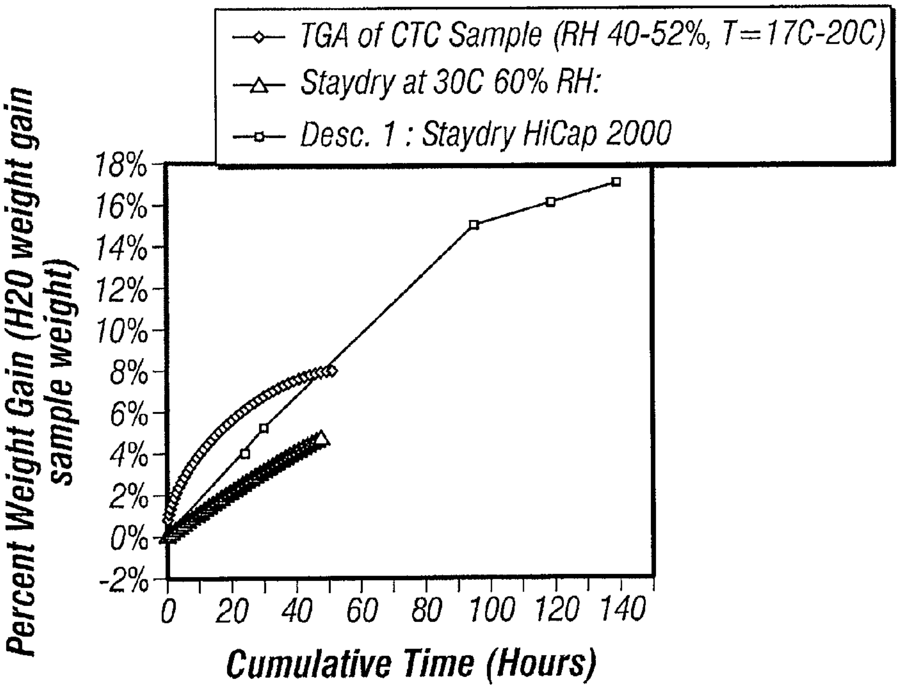
FIG. 16 is a graph comparing the percent weight gain for Zeolite™ and StayDry HiCap™ desiccants.

The above rates can be compared with the rates and saturation levels for other desiccants. Those desiccants with longer drying times (longer effective half-lives for example) can be selected in this manner. A graph comparing the drying duration and saturation levels of Zeolite (a relatively fast acting desiccant, denoted by diamonds, relative humidity of 40-52% and a temperature of 17-20° C.) and Staydry HiCap2000™ desiccant (denoted by triangles) is shown in FIG. 16. As can be seen in FIG. 16, while the initial amount of water absorbed by the desiccant is lower for the Staydry HiCap2000™ desiccant sample, this slower absorbing desiccant can continue to absorb water over a longer duration, as it is not saturated at 50 hours. The squares represent a vendor data set for Staydry HiCap2000™ desiccant at 30° C., 60% relative humidity.

In some embodiments, a prolonged acting desiccant is defined as one that has an effective half-life that is greater than that of Zeolite. A prolonged acting desiccant can also be one that, for a given amount of desiccant, has a half life that is 110-120, 120-140, 140-180, 180-250, or 250-500% of Zeolite. Alternatively, a prolonged acting desiccant can be one with a slope of no more than 0.2, 0.2-0.1, 0.1-0.05, 0.05-0.01, 0.01-0.001 mg/hour or less of water absorption for an area of 53*63 mm of desiccant. Alternatively, for a same amount of volume or mass of desiccant, the prolonged acting desiccant can continue to absorb water for 10-30, 30-50, 50-100, 100-200, 200-500% longer than for a similar amount of Zeolite. Alternatively, a prolonged acting desiccant can be defined as one that is capable of absorbing additional water after 60, 70, 80, 100, 200, 300, or more hours.

In one embodiment, a fast acting desiccant is a desiccant that absorbs water at about 0.6 mg/minute or faster and a prolonged acting desiccant is a desiccant that absorbs water at about 0.2-0.01 mg/hour or slower, as described above. In one embodiment, prolonged acting and fast acting desiccants are defined, respectively, as the two desiccants shown in FIG. 16 (Stay Dry HiCap 2000™ desiccant and Zeolite desiccant respectively).

In one embodiment, a desiccant that absorbs faster than the Zeolite desiccant is a fast acting desiccant and anything that absorbs water slower is a prolonged acting desiccant. As will be appreciated by one of skill in the art, the "fast" and "prolonged" terms refer to how quickly the desiccant reaches the end of its ability to absorb water and not necessarily how quickly water is absorbed. In a preferred embodiment, anything that absorbs water about as slow, or slower, than the Staydry HiCap 2000 desiccant can be a prolonged acting desiccant.

In some embodiments, fast and prolonged are measured by half-lives. For example, in the example shown in FIG. 16, the full amount of absorption of water by the desiccant can be 8% weight gain. Thus, a half-life of the desiccant will be the amount of time required at which 4% weight gain occurs. Half-life can be measured as the amount of time for the desiccant to absorb one-half of the weight of water it is capable of absorbing. Thus, a fast acting desiccant can have a half-life of 10 hours or less, for example, 10-9, 9-8, 8-5, 5-3, 3-1, or fewer hours. In some embodiments, a prolonged acting desiccant can have a half-life of more than 10 hours, for example, 10-20, 20-30, 30-40, 40-50, 50-60, 60-70, 70-80, or more hours. In some embodiments, the above half-lives are measured at a given humidity, for example, relative humidity. The relative humidity can be, for example, about 0-10, 10-20, 20-30, 30-40, 40-50, 50-60, 60-70, 70-80, 80-90, and 90-100% relative humidity at a given temperature, such as 50-60, 60-70, 70-80, 80-90, 90-100, 100-110, 110-120, 120-140 or more ° F. In some embodiments, dew points are used instead, as shown in the Example and Figures above. As will be appreciated by one of skill in the art, dew point can be directly translated into ppm humidity or humidity levels.

In the example above, the temperature of the chamber was about 22-28° C. and the volume of the chamber was about 427 $cm^3$. In the above example, the initial amount of water in the chamber resulted in a dew point of about +4° C. or +39° F. Alternatively, the amount of water in the air can be described in terms of parts per million, e.g., about 4990 ppm of water in air. Thus, these values can be used to help define "prolonged" and "fast" acting desiccants. For example, in some embodiments, any desiccant that is placed in a similar situation (e.g., amount of initial water, volume, and temperature) and exhibits the same or a more prolonged absorption rate than the above described prolonged acting desiccant can be a prolonged acting desiccant. In some embodiments, the relative humidity at room temperature is about 20% to 30% in the container initially. As will be appreciated by one of skill in the art, various amounts of water can be present in any container initially, and can vary, for example, between 0.0081 ppm and 12650 ppm, 2260-9800 ppm, and 3640-6580 ppm of water in air.

As will be appreciated by one of skill in the art, there are a variety of ways in which a desiccant can be made into a prolonged acting desiccant. While certain compositions can be mixed with the desiccant to slow the permeation of water into the desiccant, other approaches are also contemplated. For example, a vapor barrier can be used to reduce the amount of water vapor that is exposed to the desiccant at any one time. As will be appreciated by one of skill in the art, the "vapor barrier" would not completely block all water from the desiccant; rather, it can reduce the amount of water vapor contacting the desiccant, thereby extending the time that the desiccant can absorb water. The vapor barrier can reduce the amount of water that is on one enclosed side of the vapor barrier by any amount, for example, 1-10, 10-20, 20-40, 40-60, 60-80, 80-99% or more reduction in water or water vapor is possible. In some embodiments, the vapor barrier is a sheet that covers the desiccant. In other embodiments, the vapor barrier is a compound that is added to the desiccant (also called vapor barrier material or a desiccant half-life extending compound). There can be multiple compounds or layers applied to any one section of desiccant. The vapor barrier need not be applied to all of the desiccant, as it may be advantageous to have a fast and a prolonged acting desiccant together. In some embodiments, the desiccant half-life extending compound is mixed throughout the entire section of desiccant.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention can be embodied within a form that does not provide all of the features and benefits set forth herein, as some features can be used or practiced separately from others.

I claim:

1. A display device comprising:

a transparent substrate;

an interferometric modulator configured to modulate light transmitted through the transparent substrate;

a backplate cover sealed to said transparent substrate to form a package, wherein said interferometric modulator is inside said package; and a prolonged-acting desiccant associated with said backplate cover, wherein said prolonged-acting desiccant has a half-life for absorbing water of not less than 10 hours.

2. The display device of claim 1, wherein the prolonged acting desiccant comprises calcium oxide and wherein the half-life of the prolonged acting desiccant is not less than about 40 hours.

3. The display device of claim 1 wherein said prolonged acting desiccant comprises a polymer containing zeolites.

4. The display device of claim 3, wherein said prolonged acting desiccant absorbs water at no more than about a rate of 0.2 mg/hour.

5. The display device of claim 4, wherein said prolonged acting desiccant absorbs water at a rate of between about 0.2 mg/hour and 0.01 mg/hour.

6. The display device of claim 1, wherein the transparent substrate is glass.

7. The display device of claim 1, wherein the backplate cover is glass.

8. The display device of claim 1, wherein the device has an array of interferometric modulators disposed on the transparent substrate.

9. The display device of claim 1, wherein the backplate cover is hermetically sealed to the transparent substrate.

10. A display device comprising:

a transparent substrate;

an array of interferometric modulators disposed on the transparent substrate and configured to modulate light transmitted through the transparent substrate;

a backplate cover;

a seal disposed between the transparent substrate and the backplate cover to form a package, wherein the array of interferometric modulators is inside said package; and a prolonged-acting desiccant associated with the backplate cover, wherein the prolonged-acting desiccant has a half-life for absorbing water of not less than 10 hours.

11. The display device of claim 10, wherein the prolonged acting desiccant has a half-life of not less than 40 hours

12. The display device of claim 10, wherein the prolonged acting desiccant comprises calcium.

13. The display device of claim 10, wherein the prolonged acting desiccant comprises a polymer containing zeolites.

14. The display device of claim 10, wherein the prolonged acting desiccant absorbs water at a rate of between about 0.2 mg/hour and 0.01 mg/hour.

15. The display device of claim 10, wherein the transparent substrate is glass.

16. The display device of claim 10, wherein the backplate cover is glass.

17. The display device of claim 10, wherein the seal is a hermetic seal.

* * * * *

UNITED STATES PATENT AND TRADEMARK OFFICE

CERTIFICATE OF CORRECTION

PATENT NO. : 7,990,601 B2
APPLICATION NO. : 12/727171
DATED : August 2, 2011
INVENTOR(S) : Lauren Palmateer It is certified that error appears in the above-identified patent and that said Letters Patent is hereby corrected as shown below:

At Item 56, Page 2, Col. 2, Line 15, under Other Publications, change “micromolecular” to --macromolecular--.

At Column 1, Line 10, after “entirety” insert --.--.

At Column 1, Line 23, change “and or” to --and/or--.

At Column 5, Line 1, change “16h” to --16b--.

At Column 6, Line 33, change “Pixels” to --pixels--.

At Column 6, Line 50, change “respectively” to --respectively.--.

At Column 11, Line 48, change “non-hermetic,” to --non-hermetic--.

At Column 13, Line 31, change ““Weak point”” to --“weak point”--.

At Column 16, Line 9, change “FIG.” to --FIGS.--.

At Column 18, Line 19 (approx.), change “a,” to --a--.

At Column 21, Line 9-18, Delete “In one embodiment, a desiccant that absorbs faster than the Zeolite desiccant is a fast acting desiccant and anything that absorbs water slower is a prolonged acting desiccant. As will be appreciated by one of skill in the art, the “fast” and “prolonged” terms refer to how quickly the desiccant reaches the end of its ability to absorb water and not necessarily how quickly water is absorbed. In a preferred embodiment, anything that absorbs water about as slow, or slower, than the Staydry HiCap 2000 desiccant can be a prolonged acting desiccant.” and insert the same on Col. 21, Line 8 after “respectively).” as a continuation of the same paragraph.

At Column 23, Line 5, in Claim 11, after “hours” insert --.--.

Signed and Sealed this
Second Day of October, 2012

David J. Kappos

David J. Kappos
*Director of the United States Patent and Trademark Office*